US007270930B2

(12) United States Patent
Hauck et al.

(10) Patent No.: US 7,270,930 B2
(45) Date of Patent: Sep. 18, 2007

(54) HEAT-SENSITIVE POSITIVE WORKING LITHOGRAPHIC PRINTING PLATE PRECURSOR

(75) Inventors: Gerhard Hauck, Badenhausen (DE); Dietmar Frank, Northeim (DE)

(73) Assignee: Kodak Polychrome Graphics, GmbH, Osterode am Harz ( * ) Notice: Subject to any disclaimer, the term of this patent is extended or adjusted under 35 U.S.C. 154(b) by 0 days.

(21) Appl. No.: 10/567,245

(22) PCT Filed: Aug. 9, 2004

(86) PCT No.: PCT/EP2004/008911

§ 371 (c)(1), (2), (4) Date: Feb. 6, 2006

(87) PCT Pub. No.: WO2005/016645

PCT Pub. Date: Feb. 24, 2005

(65) Prior Publication Data

US 2006/0228643 A1 Oct. 12, 2006

(30) Foreign Application Priority Data

Aug. 14, 2003 (DE) ................................ 103 37 506

(51) Int. Cl.

| | |
|---|---|
| ***G03F 7/039*** | (2006.01) |
| ***G03F 7/14*** | (2006.01) |
| ***G03F 7/30*** | (2006.01) |

(52) U.S. Cl. ............................... 430/270.1; 430/278.1; 430/302; 430/326; 430/330; 430/905; 430/964

(58) Field of Classification Search ............. 430/270.1, 430/278.1, 302, 326, 330, 964, 905
See application file for complete search history.

(56) References Cited

U.S. PATENT DOCUMENTS

| | | | | |
|---|---|---|---|---|
| 5,080,998 | A * | 1/1992 | Irving et al. | 430/169 |
| 6,689,534 | B2 * | 2/2004 | Oda et al. | 430/270.1 |
| 2003/0129528 | A1 | 7/2003 | Ray et al. | |
| 2006/0166131 | A1 * | 7/2006 | Masuda et al. | 430/270.1 |

FOREIGN PATENT DOCUMENTS

| | | | |
|---|---|---|---|
| EP | 1 179 427 | A | 2/2002 |

* cited by examiner

*Primary Examiner*—Richard L. Schilling
(74) *Attorney, Agent, or Firm*—J. Lanny Tucker

(57) ABSTRACT

Heat-sensitive element comprising a) an optionally pre-treated substrate; b) a positive working coating comprising (i) at least 40 wt.-%, based on the dry weight of the coating, of at least one polymer soluble in aqueous alkaline developer selected from novolak resins, functionalized novolak resins, polyvinylphenol resins, polyvinyl cresols and poly (meth)acrylates with phenolic and/or sulfonamide side groups, (ii) 01-20 wt.-%, based on the dry weight of the coating, of at least one ($C_4$-$C_{20}$ alkyl)phenol novolak resin insoluble in aqueous alkaline developer, and (iii) optionally at least one further component selected from polymer particles, surfactants, contrast dyes and pigments, inorganic fillers, antioxidants, print-out dyes, carboxylic acid derivatives of cellulose polymers, plasticizers and substances capable of absorbing radiation of a wavelength from the range of 650 to 1,300 nm and converting it into heat.

15 Claims, No Drawings

HEAT-SENSITIVE POSITIVE WORKING LITHOGRAPHIC PRINTING PLATE PRECURSOR

The present invention relates to heat-sensitive positive working elements, in particular heat-sensitive printing plate precursors whose coating comprises a ($C_4$-$C_{20}$ alkyl)phenol novolak insoluble in aqueous alkaline developer; the invention furthermore relates to a process for their production and a process for imaging such elements.

The technical field of lithographic printing is based on the immiscibility of oil and water, wherein the oily material or the printing ink is preferably accepted by the image area, and the water or fountain solution is preferably accepted by the non-image area. When an appropriately produced surface is moistened with water and a printing ink is applied, the background or non-image area accepts the water and repels the printing ink, while the image area accepts the printing ink and repels the water. The printing ink in the image area is then transferred to the surface of a material such as paper, fabric and the like, on which the image is to be formed. Generally, however, the printing ink is first transferred to an intermediate material, referred to as blanket, which then in turn transfers the printing ink onto the surface of the material on which the image is to be formed; this technique is referred to as offset lithography.

A frequently used type of lithographic printing plate precursor (in this connection, the term printing plate precursor refers to a coated printing plate prior to exposure and developing) comprises a photosensitive coating applied onto a substrate on aluminum basis. The coating can react to radiation such that the exposed portion becomes so soluble that it is removed during the developing process. Such a plate is referred to as positive working. On the other hand, a plate is referred to as negative working if the exposed portion of the coating is hardened by the radiation. In both cases, the remaining image area accepts printing ink, i.e. is oleophilic, and the non-image area (background) accepts water, i.e. is hydrophilic. The differentiation between image and non-image areas takes place during exposure.

In conventional plates, a film containing the information to be transferred is attached to the printing plate precursor under vacuum in order to guarantee good contact. The plate is then exposed by means of a radiation source, part of which is comprised of UV radiation. When a positive plate is used, the area on the film corresponding to the image on the plate is so opaque that the light does not affect the plate, while the area on the film corresponding to the non-image area is clear and allows light to permeate the coating, whose solubility increases. In the case of a negative plate, the opposite takes place: The area on the film corresponding to the image on the plate is clear, while the non-image area is opaque. The coating beneath the clear film area is hardened due to the incident light, while the area not affected by the light is removed during developing. The light-hardened surface of a negative working plate is therefore oleophilic and accepts printing ink, while the non-image area that used to be coated with the coating removed by the developer is desensitized and therefore hydrophilic.

For several decades, positive working commercial printing plate precursors were characterized by the use of alkali-soluble phenolic resins and naphthoquinone diazide derivatives; imaging was carried out by means of UV radiation.

Recent developments in the field of lithographic printing plate precursors have led to radiation-sensitive compositions suitable for the production of printing plate precursors which can be addressed directly by lasers. The digital image-forming information can be used to convey an image onto a printing plate precursor without the use of a film, as is common in conventional plates.

One example of a positive working, direct laser addressable printing plate precursor is described in U.S. Pat. No. 4,708,925. The patent describes a lithographic printing plate precursor whose imaging layer comprises a phenolic resin and a radiation-sensitive onium salt. As described in the patent, the interaction between the phenolic resin and the onium salt results in an alkali solvent resistance of the composition, which restores the alkali solubility by photolytic decomposition of the onium salt. The printing plate precursor can be used as a precursor of a positive working printing plate or as a precursor of a negative printing plate, if additional process steps are added between exposure and developing, as described in detail in British patent no. 2,082,339. The printing plate precursors described in U.S. Pat. No. 4,708,925 are UV-sensitive and can additionally be sensitized to visible and IR radiation.

Another example of a direct laser addressable printing plate precursor that can be used as a positive working system is described in U.S. Pat. No. 5,372,907 and U.S. Pat. No. 5,491,046. These two patents describe the decomposition of a latent Bronsted acid by radiation in order to increase solubility of the resin matrix upon image-wise exposure. As in the case of the printing plate precursor described in U.S. Pat. No. 4,708,925, these systems can also be used as negative working systems in combination with additional process steps between imaging and developing. In the case of the negative working printing plate precursors, the decomposition products are subsequently used to catalyze a crosslinking reaction between the resins in order to render the layer of the irradiated areas insoluble, which requires a heating step prior to developing. As is the case in U.S. Pat. No. 4,708,925, these printing plate precursors per se are sensitive to UV radiation due to the acid-forming materials used therein.

EP-A-0 823 327 describes IR-sensitive printing plate precursors whose radiation-sensitive layer comprises, in addition to an IR absorber and a polymer such as for example novolak, a substance that decreases the solubility of the composition in an alkaline developer. Amongst others, sulfonic acid esters, phosphoric acid esters, aromatic carboxylic acid esters, carboxylic acid anhydrides, aromatic ketones and aldehydes, aromatic amines and aromatic ethers are mentioned as such "insolubilizers". These printing plate precursors show a high degree of IR sensitivity and do not require additional steps between exposure and developing; furthermore, they can be handled under normal lighting conditions (daylight with a certain portion of UV radiation), i.e. they do not require yellow light.

EP-A-1 241 003 describes imageable elements with a positive working thermally imageable layer comprising a binder and an insolubilizer, and an overcoat layer comprising material that reduces the alkali-solubility of phenolic resins. Cationic and non-ionic surface-active materials, such as polyethoxylated, polypropoxylated and poly(ethoxylated/propoxylated) compounds, are mentioned as material for the overcoat layer.

WO 99/21725 discloses IR-sensitive positive working printing plate precursors whose heat-sensitive layer comprises a substance that improves the resistance of the unheated areas to an attack by the alkaline developer; this substance is selected from compounds with polyalkylene oxide units, siloxanes, as well as esters, ethers and amides of multivalent alcohols, preferably siloxanes. These printing plate precursors as well are characterized by a high degree of IR sensitivity and can be handled under normal daylight conditions.

However, the use of siloxanes can entail some problems: Siloxanes are usually sold as a solution in an apolar organic solvent such as xylene; however, siloxane in such solutions has a tendency to agglomerate which results in a deterioration of quality in the coating of printing plates. Siloxane polymers and their solutions are often contaminated with traces of catalysts such as e.g. butyl titanate. Such contaminations and agglomerated siloxane particles often lead to coating imperfections in the coating of printing plates, so-called "white spots". Furthermore, the use of a commercial siloxane solution can lead to incompatibility of the polar and protic solvents usually used in coating solutions and the apolar solvents of the siloxane solution; this may entail stability problems in the coating solution. Moreover, the use of aromatic hydrocarbons in the coating solution is undesirable for health and environmental reasons.

It is therefore the object of the present invention to provide heat-sensitive elements such as lithographic printing plate precursors which solve the problems associated with siloxane without affecting IR sensitivity, developability and resistance to chemicals.

It is furthermore an object of the present invention to provide a process for the production of such elements as well as a process for imaging such elements.

The first object is surprisingly achieved by a heat-sensitive element comprising:

(a) an optionally pretreated substrate
(b) a positive working coating comprising
  (i) at least 40 wt.-%, based on the dry weight of the coating, of at least one polymer soluble in aqueous alkaline developer selected from novolak resins, functionalized novolak resins, polyvinylphenol resins, polyvinyl cresols and poly(meth)acrylates with phenolic and/or sulfonamide side groups,
  (ii) 0.1-20 wt.-%, based on the dry weight of the coating, of at least one ($C_4$-$C_{20}$ alkyl)phenol novolak resin insoluble in aqueous alkaline developer, and
  (iii) optionally at least one further component selected from substances capable of absorbing radiation of a wavelength from the range of 650 to 1,300 nm and converting it into heat, print-out dyes, plasticizers, surfactants, inorganic fillers, antioxidants, contrast dyes and pigments, polymer particles and carboxylic acid derivatives of a cellulose polymer.

The process according to the invention for imaging these elements comprises the following steps:

(a) providing an element as defined above
(b) image-wise exposure of the element to IR radiation or image-wise direct heating and
(c) removing the exposed/heated portions of the coating with an aqueous alkaline developer.

The heat-sensitive elements of the present invention can for example be printing plate precursors (in particular precursors of lithographic printing plates), printed circuit boards for integrated circuits or photomasks. The heat-sensitive compositions can also be used for producing reliefs to be used as printing forms, screens and the like.

A dimensionally stable plate or foil-shaped material is preferably used as a substrate in the production of printing plate precursors. Preferably, a material is used as dimensionally stable plate or foil-shaped material that has already been used as a substrate for printing matters. Examples of such substrates include paper, paper coated with plastic materials (such as polyethylene, polypropylene, polystyrene), a metal plate or foil, such as e.g. aluminum (including aluminum alloys), zinc and copper plates, plastic films made e.g. from cellulose diacetate, cellulose triacetate, cellulose propionate, cellulose acetate, cellulose acetatebutyrate, cellulose nitrate, polyethylene terephthalate, polyethylene, polystyrene, polypropylene, polycarbonate and polyvinyl acetate, and a laminated material made from paper or a plastic film and one of the above-mentioned metals, or a paper/plastic film that has been metallized by vapor deposition. Among these substrates, an aluminum plate or foil is especially preferred since it shows a remarkable degree of dimensional stability; is inexpensive and furthermore exhibits excellent adhesion to the coating. Furthermore, a composite film can be used wherein an aluminum foil has been laminated onto a polyethylene terephthalate film.

A metal substrate, in particular an aluminum substrate, is preferably subjected to a surface treatment, for example graining by brushing in a dry state or brushing with abrasive suspensions, or electrochemical graining, e.g. by means of a hydrochloric acid electrolyte, and optionally anodizing.

Furthermore, in order to improve the hydrophilic properties of the surface of the metal substrate that has been grained and optionally anodized in sulfuric acid or phosphoric acid, the metal substrate can be subjected to an aftertreatment with an aqueous solution of e.g. sodium silicate, calcium zirconium fluoride, polyvinyl phosphonic acid or phosphoric acid. Within the framework of the present invention, the term "substrate" also encompasses an optionally pretreated substrate exhibiting, for example, a hydrophilizing layer on its surface.

The details of the above-mentioned substrate pretreatment are known to the person skilled in the art.

According to the present invention, the polymer soluble in aqueous alkaline developer is selected from novolak resins, functionalized novolak resins, polyvinylphenol resins, polyvinyl cresols and poly(meth)acrylates with phenolic and/or sulfonamide side groups.

As used in the present invention, the term "(meth)acrylate" refers to both "acrylate" and "methacrylate"; the same applies analogously to "(meth)acrylic acid".

In the framework of the present invention, a polymer such as e.g. a novolak is considered insoluble in aqueous alkaline developer if no more than 0.1 g polymer dissolve in 100 ml of a conventional aqueous alkaline developer with a pH of 10 to 14 at room temperature (=1 ppt). On the other hand, a polymer such as e.g. novolak is considered soluble in aqueous alkaline developer if 1 g or more dissolve in 100 ml of developer at room temperature.

Novolak resins suitable for the present invention and soluble in aqueous alkaline developer (component (i)) are condensation products of one or more suitable phenols, e.g. phenol itself, m-cresol, o-cresol, p-cresol, 2,5-xylenol, 3,5-xylenol, resorcinol, pyrogallol, phenylphenol, diphenols (e.g. bisphenol-A), trisphenol, 1-naphthol and 2-naphthol with one or more suitable aldehydes such as formaldehyde, acetaldehyde, propionaldehyde, benzaldehyde and furfuraldehyde and/or ketones such as e.g. acetone, methyl ethyl ketone and methyl isobutyl ketone. The type of catalyst and the molar ratio of the reactants determine the molecular structure and thus the physical properties of the resin. Phenylphenol, xylenols, resorcinol and pyrogallol are preferably not used as the single phenol for condensation but rather in admixture with other phenols. An aldehyde/phenol ratio of about 0.5:1 to 1:1, preferably 0.5:1 to 0.8:1, and an acid catalyst are used in order to produce those phenolic resins known as "novolaks" and having a thermoplastic character. As used in the present application, however, the term "aqueous alkaline developer soluble novolak" should also encompass the phenolic resins known as "resols" which are obtained at higher aldehyde/phenol ratios and in the presence of alkaline catalysts as long as they are soluble in aqueous alkaline developers; however, resols are not preferred.

Novolaks suitable as component (i) can be prepared according to known processes or are commercially available. Preferably, the molecular weight (weight average determined by means of gel permeation chromatography using polystyrene as standard) is between 1,000 and 15,000, especially preferred between 1,500 and 10,000.

Functionalized novolaks can also be used as component (i) as long as they are soluble in aqueous alkaline developer. As used in the present invention, the term "functionalized novolaks" refers to novolaks wherein the OH group is esterified or etherified or has become part of a urethane bond due to reaction with an isocyanate. Examples of functionalized novolak resins include those of formula (IV)

(IV)

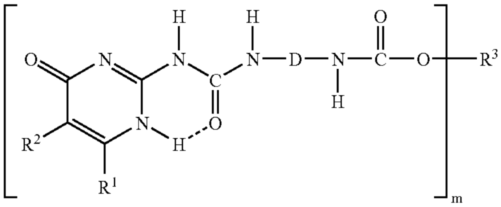

wherein the groups $R^1$ and $R^2$ are independently selected from a hydrogen atom and a cyclic or straight-chain or branched saturated or unsaturated hydrocarbon group with preferably 1 to 22 carbon atoms (preferably hydrogen and $C_1$-$C_4$ alkyl), $R^3$ is a phenolic group derived from a novolak $R^3(OH)_k$, D is a divalent cyclic or straight-chain or branched saturated or unsaturated hydrocarbon group with preferably 1 to 22 carbon atoms, which is derived from a diisocyanate of the formula $D(NCO)_2$ (e.g. isophorone diisocyanate, toluene-1,2-diisocyanate, 3-isocyanatomethyl-1-methyl-cyclohexylisocyanate), m is at least 1 and k is 1 or 2.

These functionalized novolaks of formula (IV) are capable of forming multicenter hydrogen bonds, in particular a four-center hydrogen bond (also referred to as quadrupol H bonding, or QHB). Suitable QHB compounds are also described in U.S. Pat. No. 6,320,018 B1 and U.S. Pat. No. 6,506,536 B1.

Polyvinyl phenol resins suitable for the present invention are polymers of one or more hydroxystyrenes such as o-hydroxystyrene, m-hydroxystyrene, p-hydroxystyrene, 2-(o-hydroxyphenyl)propylene, 2-(m-hydroxyphenyl)propylene and 2-(p-hydroxyphenyl)-propylene. Such a hydroxystyrene can optionally comprise one or more additional substituents at the phenyl ring, such as e.g. a halogen atom (F, Cl, Br, I). It is important that the polyvinyl phenol resin is soluble in aqueous alkaline developers.

Polyvinyl phenol resins can be produced according to known processes. Usually, one or more hydroxystyrenes are polymerized in the presence of an initiator for free-radical or cationic polymerization.

The weight-average molecular weight of suitable polyvinyl phenol resins is preferably in the range of 1,000 to 100,000, more preferably 1,500 to 50,000.

Polyacrylates with sulfonamide side groups suitable for the present invention are for example those comprising structural units of the formulas (Va) and/or (Vb) below:

$$—[CH_2—CH(CO—X^1—R^4—SO_2NH—R^5)]— \quad (Va)$$

$$—[CH_2—CH(CO—X^2—R^{4a}—NHSO_2—R^{5a})]— \quad (Vb)$$

wherein $X^1$ and $X^2$ each represent O or $NR^{16}$;

$R^4$ and $R^4$a each represent a substituted or unsubstituted alkylene group (preferably $C_1$-$C_{12}$), cycloalkylene group (preferably $C_6$-$C_{12}$), arylene group (preferably $C_6$-$C_{12}$) or aralkylene group (preferably $C_7$-$C_{14}$);

$R^1$ and $R^{16}$ each independently represent a hydrogen atom or a substituted or unsubstituted alkyl group (preferably $C_1$-$C_{12}$); cycloalkyl group (preferably $C_6$-$C_{12}$), aryl group (preferably $C_6$-$C_{12}$) or aralkyl group (preferably $C_7$-$C_{14}$);

$R^{5a}$ represents a substituted or unsubstituted alkyl group (preferably $C_1$-$C_{12}$), cycloalkyl group (preferably $C_6$-$C_{12}$), aryl group (preferably $C_6$-$C_{12}$) or aralkyl group (preferably $C_7$-$C_{14}$).

Such polyacrylates and starting monomers and comonomers for their production are described in detail in EP-A-0 544 264 (pages 3 to 5).

Polymethacrylates analogous to the polyacrylates of the formulas (Va) and (Vb) can also be used according to the present invention.

Polyacrylates with sulfonamide side groups which additionally comprise a urea group in the side chain can be used as well. Such polyacrylates are for example described in EP-A-0 737 896 and exhibit the following structural unit (Vc):

(Vc)

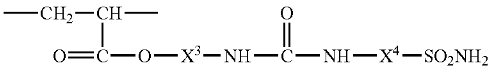

wherein $X^3$ is a substituted or unsubstituted alkylene group (preferably $C_1$-$C_{12}$), cycloalkylene group (preferably $C_6$-$C_{12}$), arylene group (preferably $C_6$-$C_{12}$) or aralkylene group (preferably $C_7$-$C_{14}$), and $X^4$ is a substituted or unsubstituted arylene group (preferably $C_6$-$C_{12}$).

Polymethacrylates analogous to the polyacrylates of formula (Vc) can also be used in the present invention.

The polyacrylates of formula (Vd) with urea groups and phenolic OH mentioned in EP-A-0 737 896 can also be used:

(Vd)

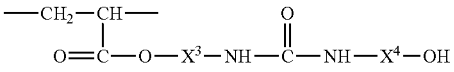

wherein $X^3$ and $X^4$ are as described above.

Polymethacrylates analogous to the polyacrylates of formula (Vd) can also be used in the present invention.

The weight-average molecular weight of suitable poly(meth)acrylates with sulfonamide side groups and/or phenolic side groups is preferably 2,000 to 300,000.

Based on the dry weight of the coating, the amount of polymer soluble in aqueous alkaline developer is at least 40 wt.-%, preferably at least 50 wt.-%, more preferred at least 70 wt.-% and particularly preferred at least 80 wt.-%. Usually the amount does not exceed 95 wt.-%, more preferred 85 wt.-%.

In the framework of the present invention, the dry weight of the coating is equated with the solids content of the coating composition(s) used for the production of the coating, even if occasionally about 2 to 10% residual solvent may remain in the coating which is not expelled during the drying and conditioning process.

According to the present invention, component (ii) is at least one novolak resin insoluble in aqueous alkaline developer obtained by condensation of a phenol substituted with $C_4$-$C_{20}$ alkyl and suitable aldehydes such as formaldehyde, acetaldehyde, propionaldehyde, benzaldehyde and furfuraldehyde, as described above in connection with component (i). In the present invention, the reaction product is also referred to simply as "($C_4$-$C_{20}$ alkyl)phenol novolak resin". Here as well, "resols" obtained at higher aldehyde/phenol ratios and in the presence of alkaline catalysts should be encompassed as well, as long as they are insoluble in aqueous alkaline developer. The starting phenols are represented by the following formula (I):

(I)

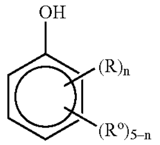

wherein each R is independently a $C_4$-$C_{20}$ alkyl group, preferably a $C_5$-$C_{10}$ alkyl group, more preferred a $C_6$-$C_8$ alkyl group and especially preferred an octyl group, each $R^o$ is independently selected from hydrogen, and hydrophobic substituents such as e.g. aryl groups, $C_1$-$C_3$ alkyl groups, fluorinated alkyl groups and silyl groups (preferably hydrogen), and n is an integer from 1 to 5, preferably 1 to 3, especially preferred 1.

If n=1, it is preferred that the group R be in p-position with respect to the OH group.

The alkyl group can be a straight-chain or branched group. For example, a butyl group encompasses an n-butyl group, sec-butyl group and tert-butyl group.

Preferably, the molecular weight of the ($C_4$-$C_{20}$ alkyl) phenol novolak resin is 600 to 600,000, especially preferred 1,000 to 20,000.

The ($C_4$-$C_{20}$ alkyl)phenol novolak resin is present in an amount of 0.1 to 20 wt.-%, based on the dry weight of the coating. Preferably, it is present in an amount of 0.5 to 15 wt.-%, especially preferred 2 to 10 wt.-%. If the amount is below 0.1 wt.-%, it is possible that upon IR irradiation no sufficient difference in exposed and unexposed areas of the coating is obtained with respect to developer solubility so that no image can be formed. In any case, the ($C_4$-$C_{20}$ alkyl)phenol novolak resin eliminates the sensitivity to developer fluctuations, what is referred to as "swirl pattern". An amount of more than 20 wt.-% does not result in a further increase in the solubility difference so that an amount of 20 wt.-% is not necessary; moreover, a maximum amount of 20 wt.-% prevents excessive formation of sludge in the developer bath due to the insoluble novolak. Furthermore, an amount in excess of 20 wt.-% leads to a decrease in photosensitivity and the required developer dwell time becomes too long.

It has been found that a ($C_4$-$C_{20}$ alkyl)phenol novolak can be used instead of siloxanes in heat-sensitive compositions without affecting the excellent developer resistance, radiation sensitivity and resistance to scratching that can be achieved by means of siloxanes.

Imaging of the heat-sensitive elements can either be carried out by direct heating or by means of IR irradiation which is absorbed by a photothermal conversion material (hereinafter also referred to as IR absorber) and converted into heat.

The chemical structure of the IR absorber is not particularly restricted as long as it is capable of converting the absorbed radiation into heat. It is preferred that the IR absorber shows an essential absorption in the range of 650 nm to 1,300 nm, preferably 750 to 1,120 nm, and preferably exhibits an absorption maximum in that range. IR absorbers showing an absorption maximum in the range of 800 to 1,100 nm are especially preferred. It is furthermore preferred that the IR absorber essentially does not absorb radiation in the UV range. The absorbers are selected e.g. from carbon black, phthalocyanine dyes and pigments, and dyes and pigments from the polythiophene-squarylium class, the thiazoluim-croconate class, the merocyanine class, the cyanine class, the indolizine class, the pyrylium class or the metaldithioline class, preferably from the cyanine class. The compounds mentioned in Table 1 of U.S. Pat. No. 6,326,122 are e.g. suitable IR absorbers. Further examples can be found in U.S. Pat. No. 4,327,169, U.S. Pat. No. 4,756,993, U.S. Pat. No. 5,156,938, WO 00/29214, U.S. Pat. No. 6,410,207 and EP-A-1 176 007.

According to one embodiment, a cyanine dye of the formula (II)

(II)

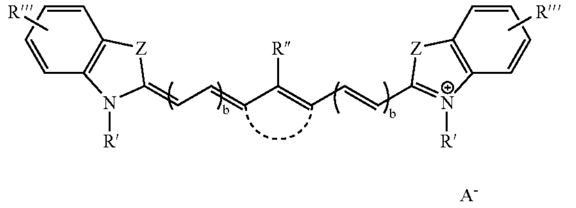

is used, wherein each Z independently represents S, O, $NR^a$ or $C(alkyl)_2$;

each R' independently represents an alkyl group, an alkylsulfonate group or an alkylammonium group;

R" represents a halogen atom, $SR^a$, $OR^a$, $SO_2R^a$ or $NR^a_2$;

each R'" independently represents a hydrogen atom, an alkyl group, —$COOR^a$, —$OR^a$, —$SR^a$, —$NR^a_2$ or a halogen atom; R'" can also be a benzofused ring;

$A^-$ represents an anion;

- - - represents an optionally present carbocyclic five- or six-membered ring;

$R^a$ represents a hydrogen atom, an alkyl or aryl group;

each b can independently be 0, 1, 2 or 3.

If R' represents an alkylsulfonate group, an inner salt can form so that no anion $A^-$ is necessary. If R' represents an alkylammonium group, a second counterion is needed which is the same as or different from $A^-$.

Z is preferably a $C(alkyl)_2$ group.

R' is preferably an alkyl group with 1 to 4 carbon atoms.

R" is preferably a halogen atom or $SR^a$.

R'" is preferably a hydrogen atom.

$R^a$ is preferably an optionally substituted phenyl group or an optionally substituted heteroaromatic group.

The dotted line preferably represents the residue of a ring with 5 or 6 carbon atoms. The counterion $A^-$ is preferably a chloride ion, trifluoromethylsulfonate or a tosylate anion.

Of the IR dyes of formula (II), dyes with a symmetrical structure are especially preferred. Examples of especially preferred dyes include:

2-[2-[2-Phenylsulfonyl-3-[2-(1,3-dihydro-1,3,3-trimethyl-2H-indole-2-ylidene)-ethylidene]-1-cyclohexene-1-yl]-ethenyl]-1,3,3-trimethyl-3H-indoliumchloride, 2-[2-[2-thiophenyl-3-[2-(1,3-dihydro-1,3,3-trimethyl-2H-indole-2-ylidene)-ethylidene]-1-cyclohexene-1-yl)-ethenyl]-1,3,3-trimethyl-3H-indoliumchloride, 2-[2-[2-thiophenyl-3-[2-(1,3-dihydro-1,3,3-trimethyl-2H-indole-2-ylidene)-ethylidene]-1-cyclopentene-1-yl)-ethenyl]-1,3,3-trimethyl-3H-indoliumtosylate, 2-[2-[2-chloro-3-[2-(1,3-dihydro-1,3,3-trimethyl-2H-benzo[e]-indole-2-ylidene)-ethylidene]-1-cyclohexene-1-yl]-ethenyl]-1,3,3-trimethyl-1H-benzo[e]-indolium-tosylate and 2-[2-[2-chloro-3-[2-ethyl-(3H-benzthiazol-2-ylidene)-ethylidene]-1-cyclohexene-1-yl]-ethenyl]-3-ethyl-benzthiazolium-tosylate.

The following compounds are also IR absorbers suitable for use in the present invention:

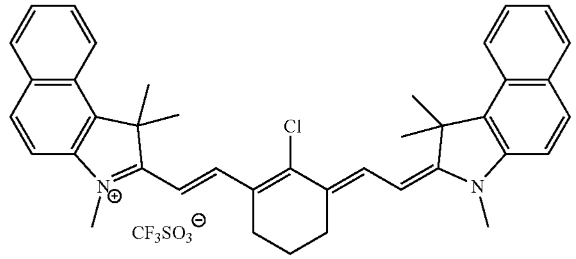

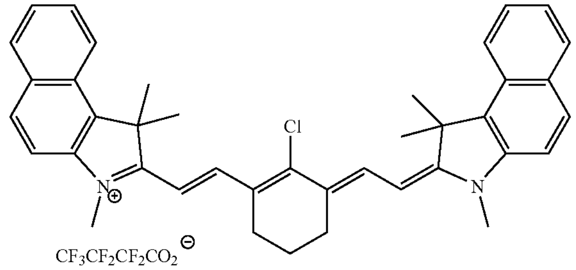

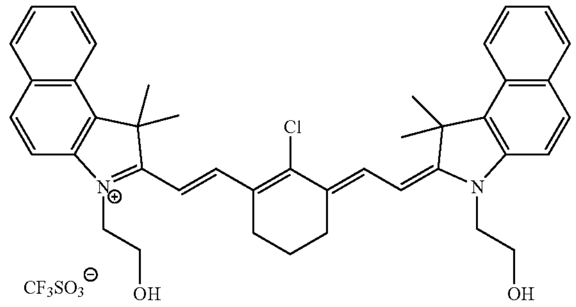

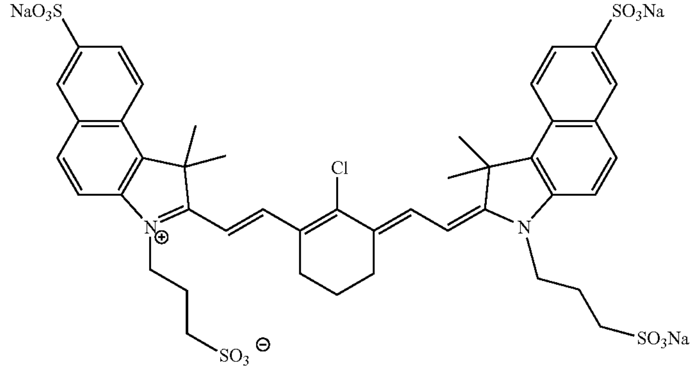

-continued
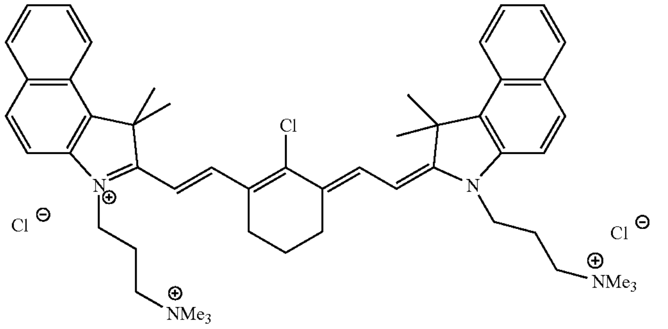
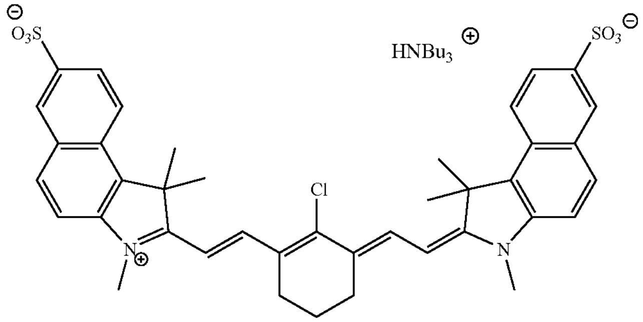
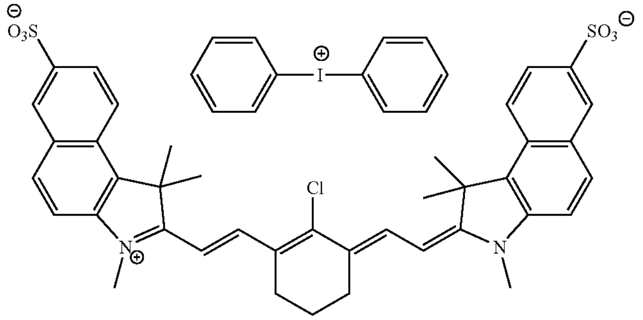
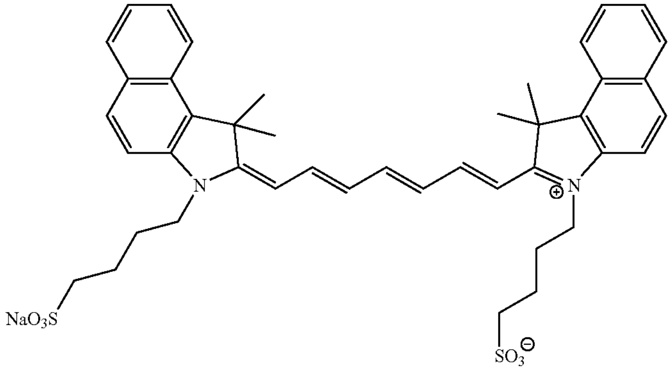
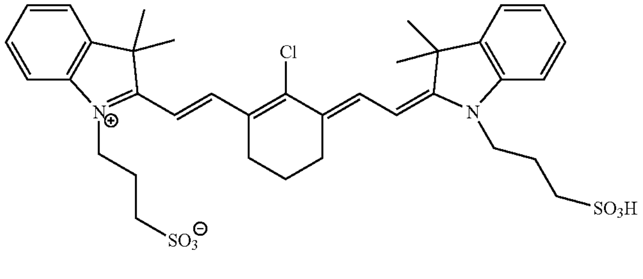

-continued
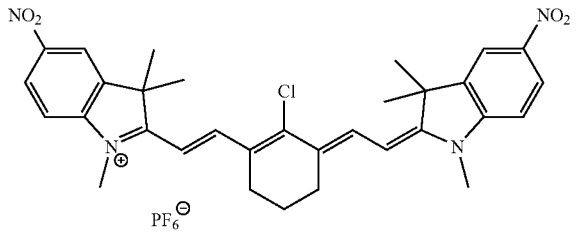
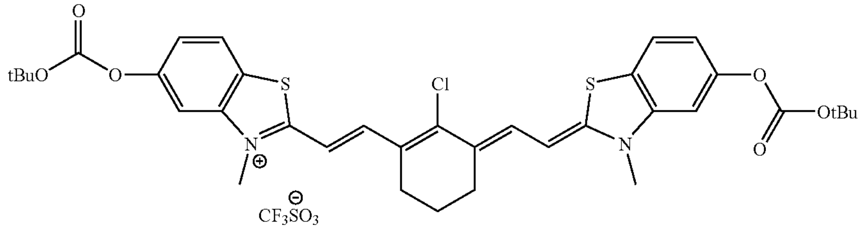
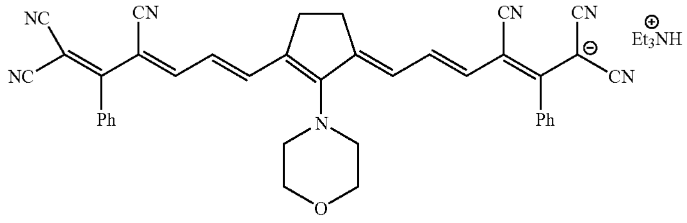
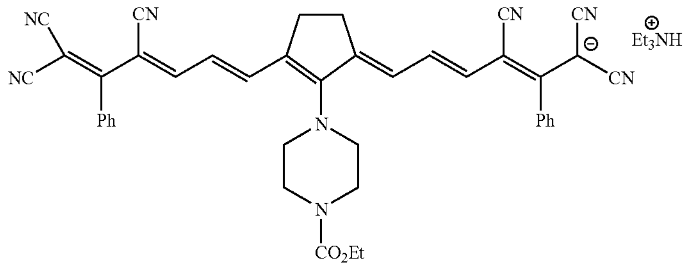
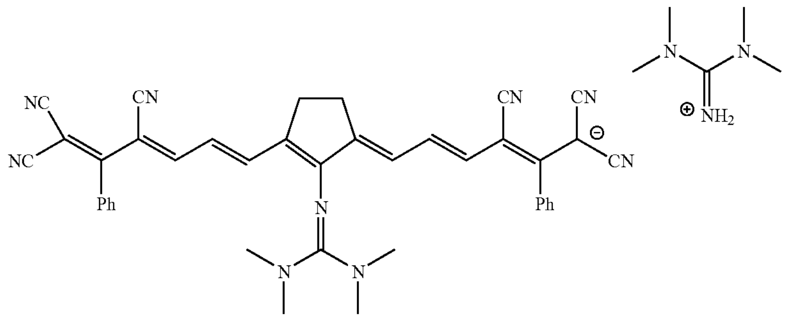
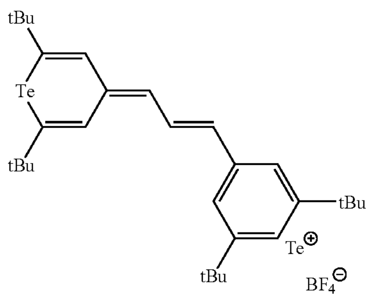
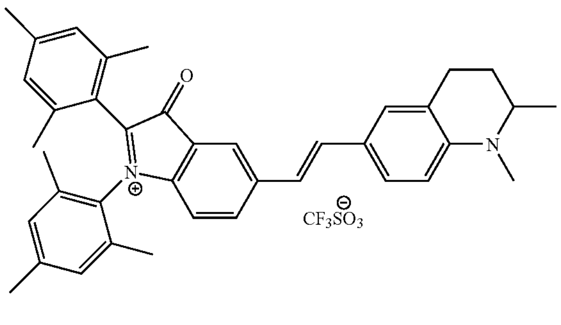

-continued

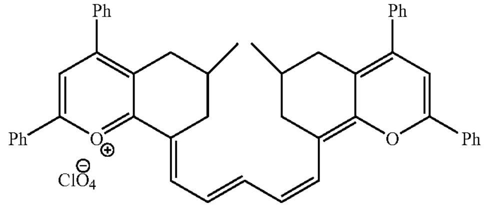

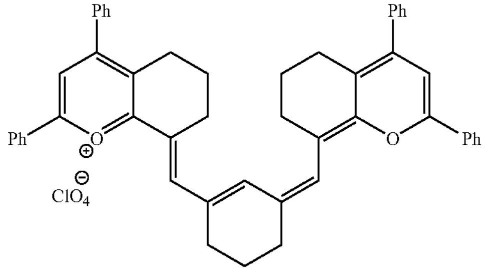

If an IR absorber is present in the heat-sensitive coating, it is preferably present in an amount of at least 0.1 wt.-%, based on the dry weight of the coating, more preferred at least 1 wt.-%, still more preferred at least 1.5 wt.-%. Usually, the amount of IR absorber does not exceed 25 wt.-%, more preferred 20 wt.-% and most preferred 15 wt.-%. A single IR absorber or a mixture of two or more can be present; in the latter case, the amounts given refer to the total amount of all IR absorbers.

The amount of IR absorber to be used also has to be considered in connection with the dry layer thickness of the coating. Preferably, it should be selected such that the optical density of the coating—measured for example on a transparent polyester film—preferably shows values between 0.4 and 20 at the wavelength of the incident IR radiation.

Furthermore, according to a preferred embodiment the coating also comprises at least, one carboxylic acid derivative of a cellulose polymer. Suitable derivatives include reaction products of a cellulose polymer, for instance of a cellulose alkanoate and a carboxylic acid or in particular an acid anhydride, wherein the carboxylic acid and the anhydride are preferably of the formulas (III) and (IIIa), respectively (III)

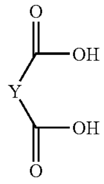

(IIIa)

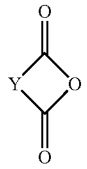

wherein

Y is selected from $—(CR^6R^7)_k—$ and $—CR^8{=}CR^9—$ wherein k is an integer from 1 to 6, each $R^6$ and $R^7$ is independently selected from a hydrogen atom and a $C_1$-$C_6$ (preferably $C_1$-$C_4$) alkyl group (if k>1 not all groups $R^6$ have to be the same nor do all groups $R^7$ have to be the same), and $R^8$ and $R^9$ are independently selected from a hydrogen atom and a $C_1$-$C_6$ (preferably $C_1$-$C_4$) alkyl group or $R^8$ and $R^9$, together with the two carbon atoms to which they are bonded, form an optionally substituted aryl or heteroaryl group.

It is especially preferred that Y be selected from:

$—CR^{10}R^{11}—CR^{12}R^{13}—$; $—CR^{14}{=}CR^{15}—$

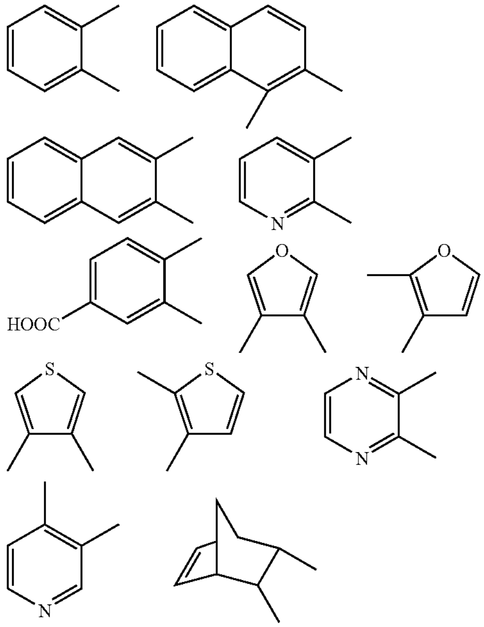

wherein $R^{10}$ to $R^{15}$ are each independently selected from a hydrogen atom and a $C_1$-$C_6$ alkyl group.

Such carboxylic acid derivatives of a cellulose polymer are for example described in EP-A-1 101 607 in paragraphs [0024] to [00373.

The commercially available derivatives such as cellulose acetate phthalate (CAP), cellulose acetate hydrogen phthalate (CAHP), cellulose acetate trimellitate (CAT), cellulose acetate propionate and cellulose acetate butyrate should be mentioned in particular in this connection.

The amount of cellulose carboxylic acid derivatives in the coating—if they are present—can account for up to 15 wt.-%, based on the dry weight of the coating, preferably up to 10 wt.-% and especially preferred up to 5 wt.-%.

The acid value of the cellulose carboxylic acid derivative is preferably at least 50, more preferably at least 80 and most preferred at least 100. Preferably, the acid value does not exceed 210.

The cellulose carboxylic acid derivative further improves the chemical resistance of the coating.

The coating can also comprise polymer particles with an average particle diameter of preferably 0.5 to 5 μm.

The coating can furthermore comprise dyes or pigments having a high absorption in the visible spectral range in order to increase contrast. Suitable dyes and pigments are those that dissolve well in the solvent or solvent mixture used for coating or can easily be introduced in the disperse form of a pigment. Suitable contrast dyes include inter alia rhodamine dyes, triarylmethane dyes such as Victoria blue R and Victoria blue BO, crystal violet and methyl violet, anthraquinone pigments, azo pigments and phthalocyanine dyes and/or pigments. The dyes are preferably present in the coating in an amount of from 0.5 to 15 wt.-%, especially preferred in an amount of from 1.5 to 7 wt.-%, based on the dry weight of the coating.

Furthermore, the layer can comprise surfactants (e.g. anionic, cationic, amphoteric or non-ionic tensides or mixtures thereof). Suitable examples include fluorine-containing polymers, polymers with ethylene oxide and/or propylene oxide groups, sorbitol-tri-stearate and alkyl-di-(aminoethyl)-glycines. They are preferably present in an amount of 0 to 10 wt.-%, based on the dry weight of the coating, especially preferred 0.2 to 5 wt.-%.

Further optional components of the radiation-sensitive composition are e.g. inorganic fillers such as e.g. $Al_2O_3$ and $SiO_2$ (they are preferably present in an amount of 0 to 20 wt.-%, based on the dry weight of the coating, especially preferred 0.1 to 5 wt.-%).

The coating can also comprise print-out dyes such as crystal violet lactone or photochromic dyes (e.g. spiropyrans etc.). They are preferably present in an amount of 0 to 15 wt.-% based on the dry weight of the coating, especially preferred 0.5 to 5 wt.-%.

The coating can furthermore comprise antioxidants such as e.g. mercapto compounds (2-mercaptobenzimidazole, 2-mercaptobenzthiazole, 2-mercaptobenzoxazole and 3-mercapto-1,2,4-triazole), and triphenylphosphate. They are preferably used in an amount of 0 to 15 wt.-%, based on the dry weight, especially preferred 0.5 to 5 wt.-%.

Since it is intended to provide heat-sensitive elements which can be handled under normal daylight (i.e. need not to be handled under specific light conditions) the positive working coating does not contain any quinone diazid compound as used in conventional UV/VIS-sensitive elements.

According to one embodiment, the coating is applied onto the optionally pretreated substrate from a solution of all components in a polar organic solvent or solvent mixture (e.g. alcohols such as methanol, n- and iso-propanol, n-and iso-butanol; ketones such as methyl ethyl ketone, methyl propyl ketone, cyclohexanone; multifunctional alcohols and derivatives thereof, such as ethylene glycol monomethyl ether and monoethyl ether, propylene glycol monomethyl ether and monoethyl ether; esters such as methyl lactate and ethyl lactate) and dried. This can be carried out by means of common coating methods such as coating with doctor blades, spin coating, and the like.

It cannot always be avoided that a residue of the used solvent remains in the coating after drying.

The dry weight of the coating in lithographic printing plate precursors is preferably 0.5 to 4.0 $g/m^2$, especially preferred 1 to 3 $g/m^2$.

According to another embodiment, the coating is produced by the subsequent application of two coating solutions: A solution comprising component (i) and optionally component (iii) is applied on the optionally pretreated substrate. A second layer is applied onto the dried layer, which second layer comprises component (ii) and optionally component (iii). Both solutions can be applied by means of common coating processes. The same solvent or solvent mixture can be used for both solutions; it is also possible to use an apolar solvent, such as toluene, for the second solution.

With respect to an imageable element prepared according to this process, the amounts given in wt.-% in this application refer to the dry weight of the total coating obtained by two coating steps.

The additives or further coating additives provided for as optional component (iii) can either be used in only one of the coating solutions or in both. It is preferred in a two-step application procedure that the second coating solution only contain solvents and alkylphenol novolak.

Preferably, the coating of the imageable element according to the present invention is produced in one step.

Imaging can be carried out by direct heat or by means of IR irradiation. If IR radiation is used, e.g. in the form of semiconductor lasers or laser diodes which emit in the range of 650 to 1,300 nm, preferably 750 to 1,120 nm, the heat-sensitive coating should comprise an IR absorber. Such laser radiation can be digitally controlled via a computer, i.e. it can be turned on or off so that an image-wise exposure of the plates can be effected via stored digitized information in the computer which results in so-called computer-to-plate (ctp) printing plates. All image-setting units with IR lasers known to the person skilled in the art can be used for this purpose.

The image wiser irradiated/heated elements such as e.g. printing plate precursors are developed with an aqueous alkaline developer, which typically has a pH value in the range of 10 to 14. For this purpose, commercially available developers can be used.

The developed printing plates can additionally be subjected to a baking step in order to increase the abrasion resistance of the printing areas; however, the printing plates according to the present invention do not necessarily have to be subjected to such a treatment since they can be used for printing a large number of copies without any deterioration in quality.

Under typical processing conditions for printing plates, the heat-sensitive elements of the present invention are preferably not sensitive to visible light and the UV portion of daylight so that they can be processed under white light and do not require yellow light conditions.

The present invention is described in more detailed in the following examples; however, they are not intended to restrict the invention in any way.

EXAMPLES

Example 1

A 10 wt.-% coating solution was prepared by dissolving the solids listed in Table 1 (the amounts given in wt.-% in the table refer to the total solids content) in a mixture of Dowanol PM (propylene glycol monomethylether from Dow Chemical) and methyl ethyl ketone (80:20 wt.-%).

TABLE 1

| Amount | Compound |
|---|---|
| 65 wt.-% | Cresol-phenol novolak from Bakelite AG, Germany (trade name: 6564 LB) |
| 23.5 wt-.% | m/p cresol novolak from Borden Chemicals (trade name: PD494 A) |
| 0.5 wt.-% | IR dye absorbing at 808 nm from Avecia (trade name: Projet 825) |
| 1 wt.-% | IR dye absorbing at 830 nm from Eastman Kodak (trade name: Trump dye) |
| 2 wt.-% | Crystal violet (from Aldrich) |
| 2 wt.-% | Cellulose acetate hydrogenphthalate polymer from Eastman Kodak |
| 6 wt.-% | p-Octylphenol novolak from Schenectady Europe, France (trade name: SP-1077) |

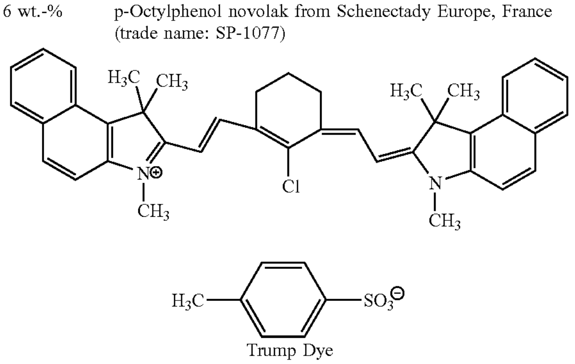

Trump Dye

The solution was applied to an electrochemically grained, anodized aluminum substrate coated with polyvinyl phosphonic acid by means of a wire-wound doctor blade, dried with hot air (resulting dry layer weight: 1.5 g/m$^2$) and subsequently heated to 105° C. for 90 seconds. Then the resulting plate was conditioned for 60 hours at 55° C.

The plate obtained from this process was evaluated by means of the following three tests:

Test 1 (Hydrophobicity):

A drop of water was applied on the unexposed coating and after projection onto a plotting paper, the drop was evaluated with the naked eye with respect to its shape. A clearly rounded drop indicates a high degree of hydrophobicity, while a flat drop indicates a low degree of hydrophobicity.

Test 2 (Developer Resistance):

At room temperature, one drop of undiluted developer for positive plates (Goldstar from Kodak Polychrome Graphics) was applied to the surface of the unexposed plate coating and the time period was measured until about 50% of the coating had been removed.

Test 3 (Resistance to Loaded Developer):

The same experiment as in Test 2 was carried out, except that a Goldstar developer was used to which 2 wt.-% novolak had been added.

The results of the Tests are shown in Table 2.

Example 2

Example 1 was repeated but instead of p-octylphenol novolak, p-tert.-butylphenol novolak (6204K from Bakelite AG) was used. The results obtained in Tests 1 to 3 are shown in Table 2.

Comparative Example 1

Example 1 was repeated but instead of p-octylphenol novolak, Silikophen P50X (50 wt.-% solution of siloxane in xylene; available from Tego Chemie) was used. The results obtained in Tests 1 to 3 are shown in Table 2.

Comparative Example 2

Example 1 was repeated but instead of p-Octylphenol novolak, p-octylphenol monomer (available from Aldrich) was used. The results obtained in Tests 1 to 3 are shown in Table 2.

TABLE 2

| Example | Test 1 | Test 2 | Test 3 |
|---|---|---|---|
| 1 | rounded drop | 90 s | 60 s |
| 2 | rounded drop | 90 s | 60 s |
| Comparative 1 | rounded drop | 90 s | 60 s |
| Comparative 2 | flat drop | 60 s | 20 s |

It can be seen from Table 2 that a coating according to the present invention exhibits the same advantages as a siloxane-containing coating with regard to hydrophobicity and developer resistance (Comparative Example 1) and is therefore suitable for replacing such a siloxane-containing coating.

Example 3 and Comparative Examples 3 and 4

A 10 wt.-% coating solution was prepared by dissolving the solids listed in Table 3 (the amounts given in wt.-% in the table refer to the total solids content) in a mixture of Dowanol PM and methyl ethyl ketone (80:20 wt.-%).

TABLE 3

| Compound | Example | Amount |
|---|---|---|
| Cresol-phenol novolak (6564LB from Bakelite AG, Germany) | Comparative 3 | 75.5 wt.-% |
| | 3 and Comparative 4 | 74 wt.-% |
| m/p-cresol novolak with high o-content of condensation (softening point 140° C.; ortho degree >3) | 3 and Comparative 3 and Comparative 4 | 19 wt.-% |
| Projet 825 | 3 and Comparative 3 and Comparative 4 | 0.5 wt.-% |
| Trump dye | 3 and Comparative 3 and Comparative 4 | 1 wt.-% |
| Crystal violet | 3 and Comparative 3 and Comparative 4 | 2 wt.-% |
| Cellulose acetate hydrogenphthalate polymer | 3 and Comparative 3 and Comparative 4 | 2 wt.-% |
| Silikophen P50X | Comparative 4 | 1.5 wt.-% |
| SP-1077 | 3 | 1.5 wt.-% |

Coating and drying was carried out as described in Example 1. Conditioning was carried out for 96 hours at 55° C.

The results are summarized in Table 4.

TABLE 4

| Example | Test 2 | Test 3 | Sensitivity[1)] | "swirl pattern"[2)] |
|---|---|---|---|---|
| 3 | 110 s | 45 s | 150 rpm/9.5 W | no |
| Comparative 3 | 90 s | 15 s | 150 rpm/9.5 W | very strong |
| Comparative 4 | 100 s | 30 s | 140 rpm/9.5 W | no |

[1)]Exposure with a Trendsetter image-setter from the company Creo; developing at 23° C. in a test tube; a 50% checkerboard pattern was used for exposure; evaluation with the naked eye
[2)]Influence of the developer movement: A plate strip of about 30 cm is immersed in a bowl filled to about 1 cm with Goldstar; this results in a fluctuating movement of the developer. The developer "loaded in-situ" that is formed on the exposed areas "overflows" into adjacentunexposed portions (areas, fine lines or points) and attacks the layer there, i.e. the area becomes paler, some fine points or lines are completely removed by the developer. The strip was evaluated after different dwell times (30, 45 and 60 seconds); the results are a measure of the developer margins.

It can be seen from Table 4 that a ($C_4$-$C_{20}$ alkyl)phenol novolak cannot only be used as a replacement for siloxane, but that sensitivity and developer resistance are even improved further.

The invention claimed is:

1. Heat-sensitive element comprising (a) an optionally pretreated substrate (b) a positive working heat-sensitive coating comprising (i) at least 40 wt.-%, based on the dry weight of the coating, of at least one polymer soluble in aqueous alkaline developer selected from novolak resins, functionalized novolak resins, polyvinylphenol resins, polyvinyl cresols and poly(meth)acrylates with phenolic and/or sulfonamide side groups, (ii) 0.1-20 wt.-%, based on the dry weight of the coating, of at least one ($C_4$-$C_{20}$ alkyl)phenol novolak resin insoluble in aqueous alkaline developer, and (iii) optionally at least one further component selected from polymer particles, surfactants, contrast dyes and pigments, inorganic fillers, antioxidants, print-out dyes, plasticizers and substances capable of absorbing radiation of a wavelength from the range of 650 to 1,300 nm and converting it into heat, wherein the heat-sensitive coating comprises a carboxylic acid derivative of a cellulose polymer.

2. Heat-sensitive element according to claim 1, wherein component (i) is a novolak resin or a mixture of novolak resins.

3. Heat-sensitive element according to claim 1 wherein component (i) is a cresol novolak, a cresol-phenol novolak or a mixture thereof.

4. Heat-sensitive element according to claim 1 wherein component (ii) is a butylphenol novolak or an octylphenol novolak.

5. Heat-sensitive element according to claim 1 wherein the at least one polymer soluble in aqueous alkaline developer is present in an amount of 50 to 95 wt.-%, based on the dry weight of the coating.

6. Heat-sensitive element according to claim 1 wherein the at least one ($C_4$-$C_{20}$ alkyl)phenol novolak resin insoluble in aqueous alkaline developer is present in an amount of 0.5 to 12 wt.-%, based on the dry weight of the coating.

7. Heat-sensitive element according to claim 1 wherein the element is a lithographic printing plate precursor.

8. Heat-sensitive element according to claim 7, wherein the substrate is an aluminum substrate which prior to being coated with the heat-sensitive coating was subjected to at least one treatment selected from (a) mechanical and/or chemical graining, (b) anodizing and (c) hydrophilizing.

9. Heat-sensitive element according to claim 7 wherein the dry weight of the coating is 0.5 to 4.0 g/$m^2$.

10. Process for the production of a heat-sensitive element as defined in claim 1 comprising:

(a) providing an optionally pretreated substrate, (b) applying a solution comprising components (i), (ii) and optionally (iii) as defined in claim 1, and (c) drying.

11. Process for the production of a heat-sensitive element comprising:

(a) an optionally pretreated substrate (b) a positive working heat-sensitive coating comprising (i) at least 40 wt.-%, based on the dry weight of the coating, of at least one polymer soluble in aqueous alkaline developer selected from novolak resins, functionalized novolak resins, polyvinylphenol resins, polyvinyl cresols and poly(meth)acrylates with phenolic and/or sulfonamide side groups, (ii) 0.1-20 wt.-%, based on the dry weight of the coating, of at least one ($C_4$-$C_{20}$ alkyl)phenol novolak resin insoluble in aqueous alkaline developer, and (iii) optionally at least one further component selected from polymer particles, surfactants, contrast dyes and pigments, inorganic fillers, antioxidants, print-out dyes, carboxylic acid derivatives of cellulose polymers, plasticizers and substances capable of absorbing radiation of a wavelength from the range of 650 to 1,300 nm and converting it into heat, said process comprising:

providing an optionally pretreated substrate, applying a solution comprising component (i) and optionally (iii) as defined above, drying, applying a solution comprising component (ii) and optionally (iii) as defined above, and drying.

12. Process for imaging a heat-sensitive element comprising:

(a) providing a heat-sensitive element as defined in claim 1, (b) image-wise exposure of the element to IR radiation or image-wise direct heating and (c) removing the exposed or directly heated areas of the coating with an aqueous alkaline developer.

13. Heat-sensitive composition comprising (a) one or more organic solvents, (b) at least 40 wt.-%, based on the total solids content, of at least one polymer soluble in aqueous alkaline developer selected from novolak resins, functionalized novolak resins, polyvinylphenol resins, polyvinyl cresols and poly(meth)acrylates with phenolic and/or sulfonamide side groups, (c) 0.1 to 20 wt.-%, based on the total solids content, of at least one ($C_4$-$C_{20}$ alkyl)phenol novolak resin insoluble in aqueous alkaline developer, and (d) optionally at least one further component selected from polymer particles, surfactants, contrast dyes and pigments, inorganic fillers, antioxidants, print-out dyes, plasticizers, and substances capable of absorbing radiation of a wavelength from the range of 650 to 1,300 nm and converting it into heat, wherein the heat-sensitive composition comprises a carboxylic acid derivative of a cellulose polymer.

14. Heat-sensitive element comprising (a) an optionally pretreated substrate (b) a positive working heat-sensitive coating comprising (i) at least 40 wt.-%, based on the dry weight of the coating, of at least one polymer soluble in aqueous alkaline developer selected from polyvinylphenol resins, polyvinyl cresols and poly(meth)acrylates with phenolic and/or sulfonamide side groups, (ii) 0.1-20 wt.-%, based on the dry weight of the coating, of at least one ($C_4$-$C_{20}$ alkyl)phenol novolak resin insoluble in aqueous alkaline developer, and (iii) optionally at least one further component selected from polymer particles, surfactants, contrast dyes and pigments, inorganic fillers, antioxidants, print-out dyes, carboxylic acid derivatives of cellulose polymers, plasticizers and substances capable of absorbing radiation of a wavelength from the range of 650 to 1,300 nm and converting it into heat.

15. Process for the production of a heat-sensitive element as defined in claim 14 comprising:

(a) providing an optionally pretreated substrate, (b) applying a solution comprising components (i), (ii) and optionally (iii) as defined in claim 14, and (c) drying.

* * * * *